(12) United States Patent
Mizusawa

(10) Patent No.: US 8,561,572 B2
(45) Date of Patent: *Oct. 22, 2013

(54) GAS SUPPLY SYSTEM, SUBSTRATE PROCESSING APPARATUS AND GAS SUPPLY METHOD

(71) Applicant: Tokyo Electron Limited, Minato-ku (JP)

(72) Inventor: Kenetsu Mizusawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/739,764

(22) Filed: Jan. 11, 2013

(65) Prior Publication Data

US 2013/0126093 A1 May 23, 2013

Related U.S. Application Data

(62) Division of application No. 13/524,613, filed on Jun. 15, 2012, now Pat. No. 8,375,893, which is a division of application No. 12/419,367, filed on Apr. 7, 2009, now Pat. No. 8,221,638, which is a division of application No. 11/615,062, filed on Dec. 22, 2006, now abandoned.

(60) Provisional application No. 60/773,676, filed on Feb. 16, 2006.

(30) Foreign Application Priority Data

Jan. 4, 2006 (JP) .................................. 2006-000241

(51) Int. Cl.
- *C23C 16/00* (2006.01)
- *C23F 1/00* (2006.01)
- *H01L 21/306* (2006.01)

(52) U.S. Cl.
USPC ............ 118/723 E; 118/723 ER; 156/345.43; 156/345.47

(58) Field of Classification Search
USPC ....... 118/723 E, 723 ER; 156/345.43, 345.47
See application file for complete search history.

(56) References Cited

U.S. PATENT DOCUMENTS

| | | | |
|---|---|---|---|
| 5,584,963 A | 12/1996 | Takahashi | |
| 6,740,166 B2 | 5/2004 | Choi | |
| 2004/0050326 A1 | 3/2004 | Thilderkvist et al. | |
| 2005/0005994 A1 | 1/2005 | Sugiyama et al. | |
| 2005/0028934 A1 | 2/2005 | Miya et al. | |
| 2006/0016559 A1 | 1/2006 | Kobayashi et al. | |
| 2007/0184563 A1 | 8/2007 | Miya et al. | |
| 2010/0163112 A1 | 7/2010 | Mizusawa et al. | |

FOREIGN PATENT DOCUMENTS

| | | |
|---|---|---|
| JP | 8-158072 | 6/1996 |
| JP | 9-45624 | 2/1997 |
| JP | 10-207554 | 8/1998 |
| JP | 2005-56914 | 3/2005 |

*Primary Examiner* — Keath Chen
(74) *Attorney, Agent, or Firm* — Oblon, Spivak, McClelland, Maier & Neustadt, L.L.P.

(57) ABSTRACT

Prior to wafer processing, pressure ratio control is executed on a divided flow rate adjustment means so as to adjust the flow rates of divided flows to achieve a target pressure ratio with regard to the pressures in the individual branch passages. As the processing gas from a processing gas supply means is diverted into first and second branch pipings under the pressure ratio control and the pressures in the branch passages then stabilize, the control on the divided flow rate adjustment means is switched to steady pressure control for adjusting the flow rates of the divided flows so as to hold the pressure in the first branch passage at the level achieved in the stable pressure condition. Only after the control is switched to the steady pressure control, an additional gas is delivered into the second branch passage via an additional gas supply means.

10 Claims, 5 Drawing Sheets

GAS SUPPLY SYSTEM, SUBSTRATE PROCESSING APPARATUS AND GAS SUPPLY METHOD

CROSS-REFERENCE TO RELATED APPLICATIONS

This application is a divisional application of, and claims the benefit of priority under 35 U.S.C. §120 from, U.S. application Ser. No. 13/524,613, filed Jun. 15, 2012, which is a divisional of U.S. Pat. No. 8,221,638, issued Jul. 17, 2012; which is a divisional of U.S. application Ser. No. 11/615,062, filed Dec. 22, 2006 claims the benefit of priority under 35 U.S.C. §119 from Japanese Patent Application Number 2006-000241, filed on Jan. 4, 2006 and claims the benefit of priority under 35 U.S.C. §120 from U.S. Provisional Application No. 60/773,676, filed Feb. 16, 2006. The entire contents of each of the above applications are incorporated herein by reference.

FIELD OF THE INVENTION

The present invention relates to a gas supply system that supplies gas into a processing chamber, a substrate processing apparatus and a gas supply method.

BACKGROUND OF THE INVENTION

In a substrate processing apparatus used in fields of application pertaining to the present invention, a specific type of processing such as film formation or etching is executed on a target substrate to undergo processing (hereafter simply referred to as a substrate), which may be a semiconductor wafer or a liquid crystal substrate, by using a specific gas supplied into a processing chamber.

Such a substrate processing apparatus may be, for instance, a plasma processing apparatus. The plasma processing apparatus may include a lower electrode also used as a stage on which a substrate is placed and an upper electrode also used as a showerhead through which the gas is injected toward the substrate, both disposed within the processing chamber. In a plane parallel plate type plasma processing apparatus such as this, plasma is generated by applying high-frequency power to the space between the two electrodes while supplying the specific gas onto the substrate placed inside the processing chamber through the showerhead and the specific type of processing such as film formation or etching is executed with the plasma thus generated.

It has been a matter of crucial importance in the related art to improve the planar uniformity achieved through the specific substrate processing, such as film formation or etching executed on the substrate by assuring consistent substrate surface processing characteristics such as the etching rate, etching selection ratio, the film formation rate or the like.

Japanese Laid Open Patent Publication No. H08-158072 (patent reference literatures 1) and Japanese Laid Open Patent Publication No. H09-045624 (patent reference literatures 2), for instance, address this need by proposing that the space within the showerhead be partitioned into a plurality of gas chambers, that gas supply pipings be connected to the individual gas chambers independently of one another and that a processing gas of a given type or at a given flow rate be supplied to each of a plurality of areas within the substrate surface. The art disclosed in patent reference literatures 1 and 2 makes it possible to improve the planar uniformity achieved through a substrate etching process by adjusting the gas concentration at the substrate surface in units of the individual local areas.

The gases used in the actual substrate processing include a plurality of types of gases such as a processing gas that directly affects the substrate processing, a gas used to control deposition of reaction products resulting from the substrate processing and a carrier gas such as an inert gas selected in a specific combination so as to best suit the material on the substrate undergoing the processing or the specific processing conditions. For this reason, a mass flow controller must be installed for purposes of flow rate control in correspondence to each of the gas supply pipings connected to the individual gas chambers in the showerhead, as disclosed in patent reference literature 2.

However, such a structure in the related art, which includes a gas supply system in correspondence to the gas to be supplied from each gas chamber even if the gases used for different purposes may contain a common gas constituent, necessitates flow rate control to be executed separately for the gas supplied from each gas chamber. This is bound to result in a complex piping structure and require complex flow rate control for the individual pipings, necessitating, for instance, a large piping space and leading to a significant increase in the control onus.

In addition, even if the gases can be supplied through simple control from a plurality of areas within the processing chamber, the desired level of planar uniformity must be assured by ensuring that the control does not allow any fluctuation of the flow rate ratio (divided flow ratio) of the processing gases supplied from the various positions that may occur due to, for instance, a fluctuation of the pressures with which the gases are drawn in. In other words, the gas supply must be controlled without being affected by pressure fluctuations or the like.

SUMMARY OF THE INVENTION

Accordingly, an object of the present invention, which has been completed by addressing the problems discussed above, is to provide a gas supply system with a simple piping structure and the like, with which the desired level of planar uniformity is achieved by supplying the gases from a plurality of positions within the processing chamber under simple control.

The object described above is achieved in an aspect of the present invention by providing a gas supply system that supplies gases into a processing chamber where a substrate undergoing processing is processed, comprising a processing gas supply means for supplying a processing gas to be used to process the substrate, a processing gas supply passage through which the processing gas from the processing gas supply means flows, a first branch passage and a second branch passage branching from the processing gas supply passage and connected to the processing chamber at different positions, a divided flow rate adjustment means for adjusting the divided flow rates of the processing gas diverted into the individual branch passages from the processing gas supply passage based upon the pressures within the branch passages, an additional gas supply means for supplying an additional gas, an additional gas supply passage through which the additional gas from the additional gas supply means is made to flow into the second branch passage at a position further downstream relative to the divided flow rate adjustment means and a control means for supplying the processing gas via the processing gas supply means and executing pressure ratio control on the divided flow rate adjustment means to adjust the divided flow rates so as to achieve a target pressure ratio for the pressures within the individual branch passages before processing the substrate and for supplying the additional gas via the additional gas supply means after switching the control on the divided flow rate adjustment means to steady pressure control through which the divided flow rates are adjusted so as to hold the pressure in the first branch passage at a level achieved in stable pressure conditions once the pressures in the individual branch passages become stabilized.

The object described above is achieved in another aspect of the present invention by providing a substrate processing apparatus comprising a processing chamber where a substrate is processed, a gas supply system that supplies gases into the processing chamber and a control means for controlling the gas supply system. The gas supply system in the substrate processing apparatus comprises a processing gas supply means for supplying a processing gas to be used to process the substrate, a processing gas supply passage through which the processing gas from the processing gas supply means flows, a first branch passage and a second branch passage branching from the processing gas supply passage and connected to the processing chamber at different positions, a divided flow rate adjustment means for adjusting the divided flow rates of the processing gas diverted into the individual branch passages from the processing gas supply passage based upon the pressures within the branch passages, an additional gas supply means for supplying an additional gas and an additional gas supply passage through which the additional gas from the additional gas supply means is made to flow into the second branch passage at a position further downstream relative to the divided flow rate adjustment means. The control means supplies the processing gas via the processing gas supply means and executes pressure ratio control on the divided flow rate adjustment means to adjust the divided flow rates so as to achieve a target pressure ratio for the pressures within the individual branch passages before processing the substrate and supplies the additional gas via the additional gas supply means after switching the control on the divided flow rate adjustment means to steady pressure control through which the divided flow rates are adjusted so as to hold the pressure in the first branch passage at a level achieved in stable pressure conditions once the pressures in the individual branch passages become stabilized.

The object described above is also achieved in yet another aspect of the present invention by providing a gas supply method to be adopted in conjunction with a gas supply system that supplies gases into a processing chamber where a substrate is processed. The gas supply system comprises a processing gas supply means for supplying a processing gas to be used to process the substrate, a processing gas supply passage through which the processing gas from the processing gas supply means flows, a first branch passage and a second branch passage branching from the processing gas supply passage and connected to the processing chamber at different positions, a divided flow rate adjustment means for adjusting the divided flow rates of the processing gas diverted into the individual branch passages from the processing gas supply passage based upon the pressures within the branch passages, an additional gas supply means for supplying an additional gas and an additional gas supply passage through which the additional gas from the additional gas supply means is made to flow into the second branch passage at a position further downstream relative to the divided flow rate adjustment means. The gas supply method includes a step executed before processing the substrate, in which the processing gas is supplied via the processing gas supply means and pressure ratio control is executed on the divided flow rate adjustment means to adjust the divided flow rates so as to achieve a target pressure ratio for the pressures inside the individual branch passages and a step executed once the pressures within the branch passages become stabilized through the pressure ratio control in which the additional gas is supplied via the additional gas supply means after switching the control on the divided flow rate adjustment means to steady pressure control for adjusting the divided flow rates so as to hold the pressure in the first branch passage at a level achieved in stable pressure conditions.

According to the present invention described above, the processing gas from the processing gas supply means is diverted into the first and second branch passages, the processing gas originating from the processing gas supply means is directly supplied into the processing chamber through the first branch passage and the processing gas, the gas composition and flow rate of which are adjusted by adding the additional gas, is supplied into the processing chamber through the second branch passage. This means that a gas constituent common in the processing gases flowing through the individual branch passages is supplied from the common processing gas supply means whereas the gas composition and the flow rate of the processing gas flowing through the second branch passage are adjusted by adding the additional gas as necessary. Since the structure requires the minimum number of pipings and thus simplifies the piping structure, the flow rate control, too, can be simplified.

In addition, since the divided flow control on the divided flow rate adjustment means is switched from the pressure ratio control to the steady pressure control before supplying the additional gas, the processing gas that should flow into the second branch passage is not allowed to flow into the first branch passage even if the pressure inside the second branch passage fluctuates when the additional gas is supplied into the second branch passage. As a result, a specific flow rate ratio (divided flow ratio) is sustained for the flows of the processing gas diverted into the individual branch passages even as the additional gas is supplied, allowing the processing gas, the flow of which is divided at a desired flow rate ratio to be delivered to different areas of the substrate surface. Thus, the desired level of planar uniformity can be achieved.

Once the pressures within the individual branch passages become stabilized after starting the additional gas supply, the control means may designate the pressure ratio of the pressures in the branch passages detected in the stable pressure conditions as a new target pressure ratio and may switch the control on the divided flow rate adjustment means to pressure ratio control for adjusting the divided flow rates so as to match the pressure ratio of the pressures in the branch passages with the new target pressure ratio. By reverting the control on the divided flow rate adjustment means from the steady pressure control to the pressure ratio control as described above, the pressure ratio of the pressures within the individual branch passages can be held unchanged through the pressure ratio control, since the pressures in the branch passages also fluctuate if the conductance at the gas supply holes changes and the pressure ratio is thus controlled to remain unchanged. In other words, even if the conductance at the gas supply holes changes over time, the flow rate ratio of the flows of the processing gas diverted into the individual branch passages can be held steady at the target level.

In addition, the divided flow rate adjustment means may include valves each used to adjust the flow rate of the processing gas flowing through one of the branch passages and pressure sensors each used to measure the pressure within one of the branch passages. Such a divided flow rate adjustment means is capable of adjusting the flow rate ratio of the flows of the processing gas originating from the processing gas supply passage by adjusting the degrees of openness of the valves based upon the pressures detected with the individual pressure sensors.

The processing gas supply means may include a plurality of gas supply sources and may supply into the processing gas supply passage the processing gas constituted with a mixed gas achieved by mixing gases from the individual gas supply sources delivered at specific flow rates. In addition, the additional gas supply means may include a plurality of gas supply sources and may supply into the additional gas supply passage the additional gas constituted with a mixed gas containing selected gases among the gases from the various gas supply sources or containing gases delivered from the gas supply sources and mixed at a predetermined gas flow rate ratio. In this structure, the processing gas constituted with a mixed gas containing a plurality of common gas constituents to be delivered into both branch passages, is supplied from the processing gas supply means and the additional gas is added as necessary to the processing gas flowing through the second branch passage so as to adjust its gas composition or its flow rate. As a result, a further reduction is achieved in the number of pipings required in the structure, resulting in an even simpler piping structure.

Furthermore, the first branch passage may be disposed so that the processing gas flowing through the passage is supplied toward a central area on the substrate surface in the processing chamber and the second branch passage may be disposed so that the processing gas flowing through the passage is supplied toward a peripheral area of the substrate surface. By adopting this positional arrangement, a further improvement can be achieved in the processing uniformity over the central area and the peripheral area of the substrate.

The second branch passage may be made up of a plurality of branch passages branching from the processing gas supply passage so that the additional gas from the additional gas supply means can be delivered into the plurality of second branch passages. In this case, the processing gas can be delivered to each of a plurality of areas in the periphery of the substrate, which enables even finer control for achieving processing uniformity at the peripheral area of the substrate.

The present invention provides a gas supply system assuming a simple piping structure and the like with which a gas can be supplied from a plurality of positions within the processing chamber under simple control the desired level of planar uniformity can be assured.

DETAILED DESCRIPTION OF THE PREFERRED EMBODIMENT

Figure 1:
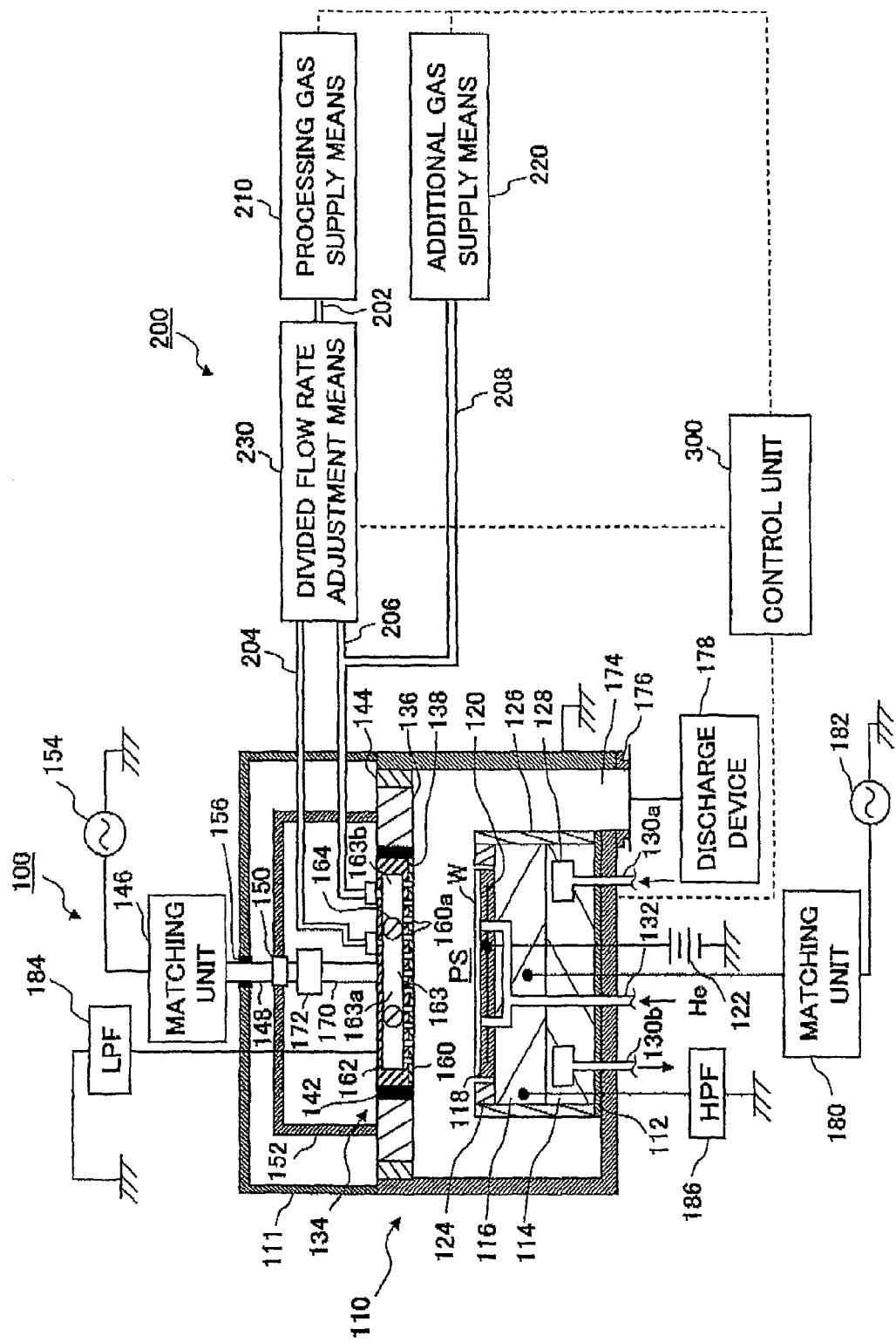
FIG. 1 is a sectional view of an example of a structure that may be adopted in a substrate processing apparatus achieved in an embodiment of the present invention.

The following is a detailed explanation of the preferred embodiment of the present invention, given in reference to the attached drawings. It is to be noted that in the specification and the drawings, the same reference numerals are assigned to components with substantially identical functions and structural features so as to eliminate the need for a repeated explanation thereof.

(Structural Example for Substrate Processing Apparatus)

First, the substrate processing apparatus achieved in the embodiment of the present invention is explained in reference to a drawing. FIG. 1 is a sectional view schematically showing the structure adopted in the substrate processing apparatus in the embodiment. The substrate processing apparatus in the figure is a plain parallel plate-type plasma etching apparatus.

The substrate processing apparatus 100 includes a processing chamber 110 constituted with a substantially cylindrical processing container. The processing container, which may be constituted of, for instance, an aluminum alloy, is electrically grounded. In addition, the inner wall surfaces of the processing container are coated with an alumina film or an yttrium oxide film.

Inside the processing chamber 110, a susceptor 116 constituting a lower electrode also to function as a stage, on which a wafer W, i.e., a substrate to undergo processing, is placed, is disposed. More specifically, the susceptor 116 is supported on a susceptor support base 114 assuming the shape of a circular column, which is disposed at a substantial center at the bottom via an insulating plate 112 within the processing chamber 110. The susceptor 116 may be constituted of, for instance, an aluminum alloy.

Over the susceptor 116, an electrostatic chuck 118, which holds the wafer W, is disposed. The electrostatic chuck 118 includes an internal electrode 120. A DC power source 122 is electrically connected to the electrode 120. The wafer W can be attracted and pulled onto the upper surface of the electromagnetic chuck 118 through the coulomb force generated as a DC voltage is applied to the electrode 120 from the DC power source 122.

In addition, a focus ring 124 is disposed at the upper surface of the susceptor 116 so as to enclose the periphery of the electrostatic chuck 118. It is to be noted that a cylindrical inner wall member 126 constituted of, for instance, quartz, is attached to the outer circumferential surfaces of the susceptor 116 and the susceptor support base 114.

A coolant space 128 assuming a ring shape is formed inside the susceptor support base 114. The coolant space 128 is made to communicate with a chiller unit (not shown), which may be installed, for instance, outside the processing chamber 110, via pipings 130a and 130b. The coolant (a liquid coolant or cooling water) is supplied via the pipings 130a and 130b so that the coolant circulates through the coolant space 128. The temperature of the wafer W placed on the susceptor 116 is thus controlled.

A gas supply line 132 passing through the susceptor 116 and the susceptor support base 114 is connected to the upper surface of the electrostatic chuck 118. A heat transfer gas (backside gas) such as He gas can be delivered to the area between the wafer W and the electrostatic chuck 118 via this gas supply line 132.

Above the susceptor 116, an upper electrode 134 is disposed so as to range parallel to and face opposite the susceptor 116 constituting the lower electrode. A plasma generation space PS is formed between the susceptor 116 and the upper electrode 134.

The upper electrode 134 includes an inner upper electrode 138 assuming a disc shape and an outer upper electrode 136 assuming a ring shape and encircling the inner upper electrode 138 from the outside. A dielectric member 142 assuming a ring shape is disposed between the outer upper electrode 136 and the inner upper electrode 138. An insulating shield 144 assuming a ring shape, which may be constituted of, for instance, alumina, is fitted with a high level of airtightness between the outer upper electrode 136 and the inner circumferential wall of the processing chamber 110.

A first high-frequency power source 154 is electrically connected to the outer upper electrode 136 via a feeder tube 152, a connector 150, an upper feeder rod 148 and a matching unit 146. A high frequency voltage with a minimum frequency of 40 MHz (e.g., 60 MHz) can be output from the first high-frequency power source 154.

The lower end of the feeder tube 152, which may assume a substantially cylindrical shape with an open bottom, is connected to the outer upper electrode 136. The lower end of the upper feeder rod 148 is electrically connected via the connector 150 to the center of the upper surface of the feeder tube 152. The upper end of the upper feeder rod 148 is connected to the output side of the matching unit 146. The matching unit 146, connected to the first high-frequency power source 154, matches the internal impedance at the first high-frequency power source with a load impedance.

The exterior of the feeder tube 152 is covered with a cylindrical grounded conductor 111 which includes a circular side wall with a diameter substantially equal to the diameter of the processing chamber 110. The lower end of the grounded conductor 111 is connected to the top of the side wall of the processing chamber 110. The upper feeder rod 148 mentioned earlier passes through the central area of the upper surface of the grounded conductor 111, with an insulating member 156 disposed over the area where the grounded conductor 111 and the upper feeder rod 148 contact each other.

The inner upper electrode 138 constitutes a showerhead through which a specific gas is delivered onto the wafer W placed on the susceptor 116. The inner upper electrode 138 includes a round electrode plate 160 having formed therein numerous gas supply holes 160a and an electrode support member 162 that detachably supports the upper surface side of the electrode plate 160. The electrode support member 162 assumes the shape of a disc with a diameter substantially equal to the diameter of the electrode plate 160.

A buffer space 163 constituted with a cylindrical space is formed inside the electrode support member 162. An annular barrier member 164 is installed inside the buffer space 163 and the buffer space 163 is divided by the annular barrier member 164 into an inner first buffer space 163a constituted with a cylindrical space and an outer second buffer space 163b constituted with a ring-shaped space surrounding the first buffer space 163a. This annular barrier member 164 may be constituted with, for instance, an O-ring.

The first buffer space 163a is formed so as to face opposite the central area (the central portion) of the wafer W placed on the susceptor 116, whereas the second buffer space 163b is formed so as to face opposite the peripheral area (edge portion) of the wafer W surrounding the central area.

The gas supply holes 160a communicate with the lower surface ranging over the buffer spaces 163a and 163b. Thus, a specific gas can be injected toward the central portion of the wafer W via the first buffer space 163a, whereas the specific gas can be injected toward the edge portion of the wafer W via the second buffer space 163b. The specific gas is supplied via a gas supply system 200 into the individual buffer spaces 163a and 163b.

A lower feeder tube 170 is electrically connected to the upper surface of the electrode support member 162, as shown in FIG. 1. The lower feeder tube 170 is connected to the upper feeder rod 148 via the connector 150. A variable capacitor 172 is installed in the lower feeder tube 170. Through adjustment of the electrostatic capacity of the variable capacitor 172, the relative ratio of the intensity of the electrical field formed directly under the outer upper electrode 136 and the intensity of the electrical field formed directly under the inner upper electrode 138 as the high frequency voltage from the first high-frequency power source 154 is applied can be adjusted.

An exhaust port 174 is formed at the bottom of the processing chamber 110. The exhaust port 174 is connected via an exhaust pipe 176 to an exhaust device 178 which includes a vacuum pump and the like. As the processing chamber 110 is evacuated with the exhaust device 178, the pressure within the processing chamber 110 can be lowered so as to achieve a desired degree of vacuum.

A second high-frequency power source 182 is electrically connected to the susceptor 116 via a matching unit 180. A high frequency voltage in a range of 2 to 20 MHz, e.g., a high frequency voltage with a frequency of 2 MHz, can be output from the second high-frequency power source 182.

A low pass filter 184 is electrically connected to the inner upper electrode 138 constituting part of the upper electrode 134. The low pass filter 184 is installed so as to block the high-frequency from the first high-frequency power source 154 and pass the high-frequency from the second high-frequency power source 182 to the ground. A high pass filter 186 is electrically connected to the susceptor 116 constituting the lower electrode. The high pass filter 186 is installed so as to pass the high-frequency from the first high-frequency power source 154 to the ground.

(Gas Supply System)

Next, the gas supply system 200 is explained in reference to drawings. In the example presented in FIG. 1, the processing gas is divided into two flows, i.e., a first processing gas (processing gas for the center portion) to be delivered toward the central portion of the wafer W inside the processing chamber 110 and a second processing gas (processing gas for the edge portion) to be delivered toward the edge portion of the wafer W. It is to be noted that instead of dividing the processing gas into two separate flows as in the embodiment, the processing gas may be divided into three or more separate flows.

As shown in FIG. 1, the gas supply system 200 comprises a processing gas supply means 210 for supplying a processing gas to be used to execute a specific type of processing on the wafer W, such as film formation or etching, and an additional gas supply means 220 for supplying a specific type of additional gas. The processing gas supply means 210 is connected with a processing gas supply piping 202 constituting a processing gas supply passage, and a first branch piping 204 to constitute a first branch passage and a second branch piping 206 to constitute a second branch passage both branch out from the processing gas supply piping 202. It is to be noted that the first and second branch pipings 204 and 206 may branch out inside a divided flow rate adjustment means 230 or they may branch outside the divided flow rate adjustment means 230.

The first and second branch pipings 204 and 206 are connected to the upper electrode 134 in the processing chamber 110 at different positions, e.g., to the first and second buffer spaces 163a and 163b in the inner upper electrode 138.

The gas supply system 200 further includes the divided flow rate adjustment means (e.g., a flow splitter) 230 for adjusting the flow rates of the divided processing gas flows, i.e., the first processing gas and the second processing gas, through the first and second branch pipings 204 and 206 based upon the pressures detected within the first and second branch pipings 204 and 206. In addition, the additional gas supply means 220 is connected to the second branch piping 206 at a middle position therein via an additional gas supply piping 208 at a position further downstream relative to the divided flow rate adjustment means 230.

In the gas supply system 200 adopting the structure described above, the processing gas originating from the processing gas supply means 210 is diverted into the first branch piping 204 and the second branch piping 206 with the divided flow rates adjusted by the divided flow rate adjustment means 230. The first processing gas flowing through the first branch piping 204 is delivered toward the central portion of the wafer W via the first buffer space 163a, whereas the second processing gas flowing through the second branch piping 206 is delivered toward the edge portion of the wafer W via the second buffer space 163b.

After the additional gas is supplied from the additional gas supply means 220 in this gas supply system, the additional gas flows through the additional gas supply piping 208 into the second branch piping 206 where it is mixed with the second processing gas. Then, the additional gas, mixed with the second processing gas is delivered toward the edge portion of the wafer W via the second buffer space 163b. It is to be noted that a specific example of a structure that may be adopted in the gas supply system 200 is to be described in detail later.

A control unit 300, which controls the various units of the substrate processing apparatus 100, is connected to the substrate processing apparatus 100. The control unit 300 controls the DC power source 122, the first high-frequency power source 154, the second high-frequency power source 182 and the like as well as the processing gas supply means 210, the additional gas supply means 220, the divided flow rate adjustment means 230 and the like in the gas supply system 200.

(Structural Example for Control Unit)

Figure 2:
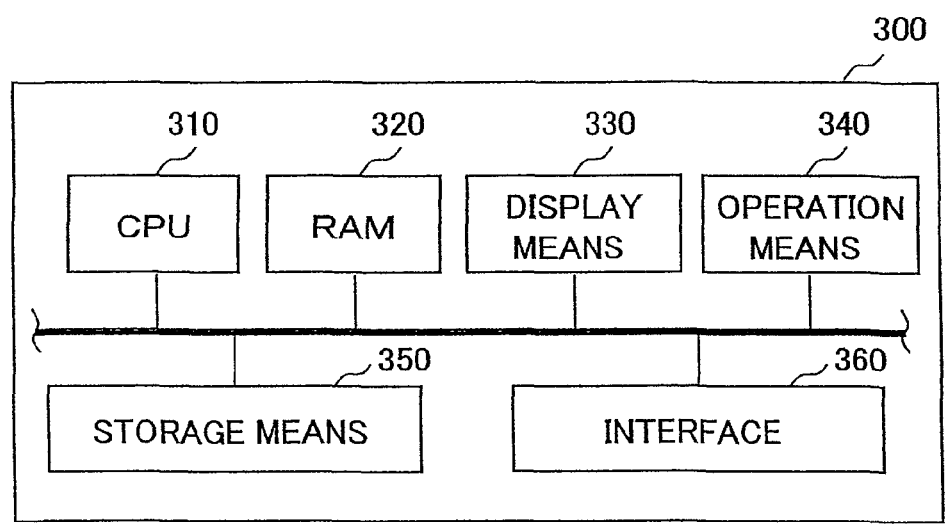
FIG. 2 is a block diagram showing an example of a structure that may be adopted in the control unit in FIG. 1.

An example of a structure that may be adopted in the control unit 300 is now explained in reference to a drawing. FIG. 2 is a block diagram showing an example of a structure that may be adopted in the control unit 300. As shown in FIG. 2, the control unit 300 comprises a CPU (central processing unit) 310 constituting the control unit main body, a RAM (random access memory) 320 that includes a memory area to be used by the CPU 310 when it executes various types of data processing, a display means 330 constituted with a liquid crystal display or the like at which an operation screen, a selection screen and the like are displayed, an operation means 340 constituted with, for instance, a touch panel through which the operator is able to input and edit various types of data such as process recipes and various types of data including process recipes and process logs can be output into a specific storage medium, a storage means 350 and an interface 360.

Processing programs that enable the execution of various types of processing in the substrate processing apparatus 100, information (data) needed for the execution of the processing programs and the like are stored in the storage means 350. The storage means 350 may be constituted with a memory, a hard disk (HDD) or the like. The CPU 310 reads out program data and the like as required to execute the processing programs for specific types of processing. For instance, the CPU 310 executes gas supply processing by controlling the gas supply system 200 so as to supply the specific gas into the processing chamber 110 before the wafer W is processed.

The various units controlled by the CPU 310, such as the divided flow rate adjustment means 230, the processing gas supply means 210 and the additional gas supply means 220, are connected to the interface 360. The interface 360 may be constituted with, for instance, a plurality of I/O ports.

The RAM 320, the display means 330, the operation means 340, the storage means 350, the interface 360 and the like are connected with the CPU 310 via a bus line such as a control bus or a data bus.

(Structural Example for Gas Supply System)

Figure 3:
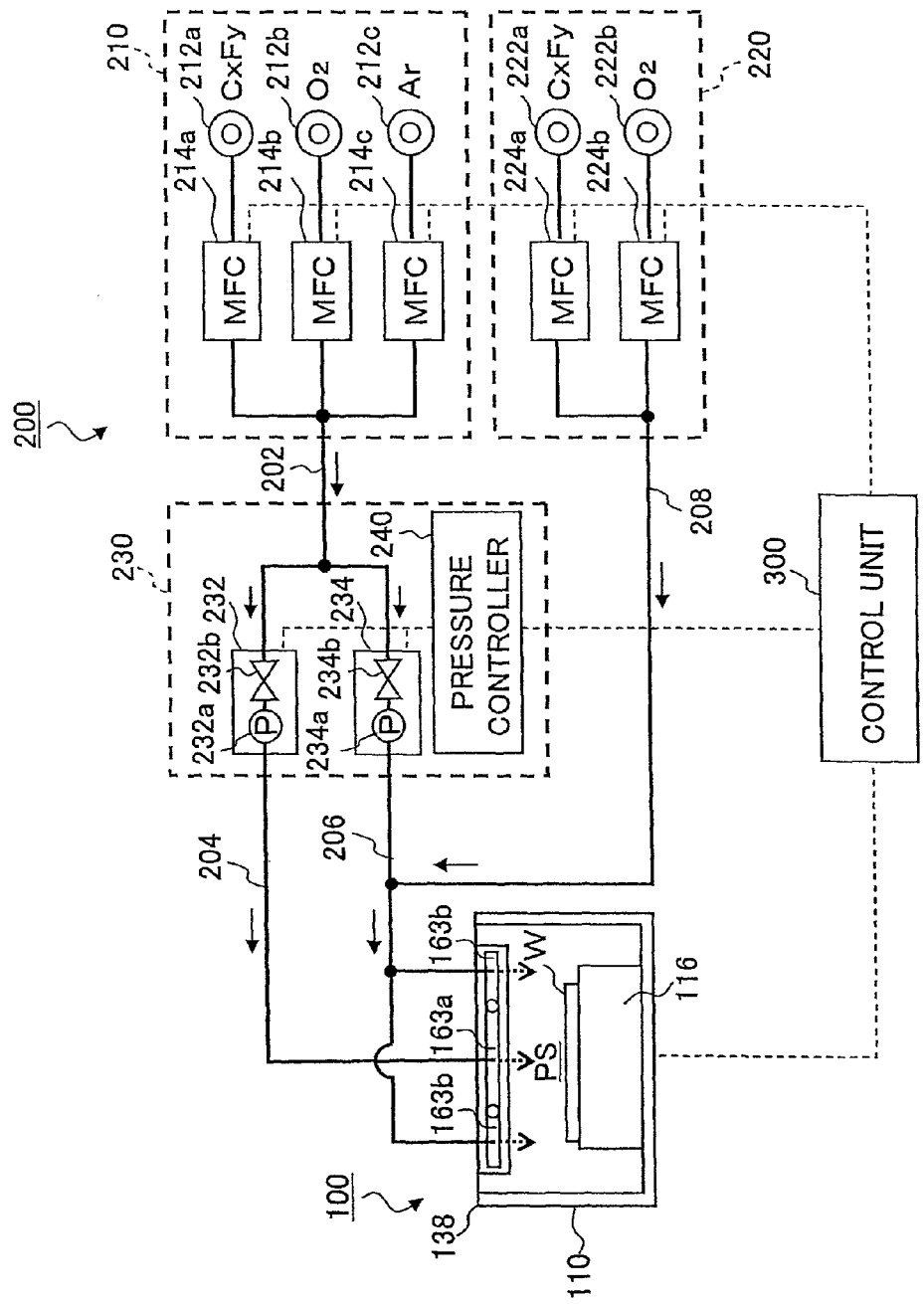
FIG. 3 is a block diagram showing an example of a structure that may be adopted in the gas supply system in the embodiment.

Next, specific structural examples that may be adopted in the individual units constituting the gas supply system 200 are explained. FIG. 3 is a block diagram presenting a specific structural example for the gas supply system 200. The processing gas supply means 210 may be constituted with a gas box housing therein a plurality of (e.g., three) gas supply sources 212a, 212b and 212c, as shown in FIG. 3. The pipings for the individual gas supply sources 212a to 212c are connected to the processing gas supply piping 202 where the individual gas constituents from the different gas supply sources flow as a mixed gas. At the piping corresponding to each of the gas supply sources 212a to 212c, one of mass flow controllers 214a to 214c is installed in order to adjust the flow rate of the specific gas constituent. The gas constituents from the individual gas supply sources 212a to 212c are thus mixed so as to achieve a predetermined flow rate ratio at the processing gas supply means 210 adopting the structure described above, and the mixed gas, which then flows out into the processing gas supply piping 202, is diverted into the first and second branch pipings 204 and 206.

The gas supply source 212a is filled with a $C_xF_y$ gas, constituted with a fluorocarbon fluorine compound such as $CF_4$, $C_4F_6$, $C_4F_8$ or $C_5F_8$, to be used as, for instance, an etching gas, as shown in FIG. 3. The gas supply source 212b is filled with $O_2$ gas, for instance, to be used to control the deposition of, for instance, CF reaction products. The gas supply source 212c is filled with rare gas such as an Ar gas to be used as a carrier gas. It is to be noted that the number of gas supply sources at the processing gas supply means 210 is not limited to that in the example shown in FIG. 3, and there may be a single gas supply source, two gas supply sources or four or more gas supply sources in the processing gas supply means 210.

The additional gas supply means 220 may be constituted with a gas box housing therein a plurality of (e.g., two) gas supply sources 222a and 222b, as shown in FIG. 3. The pipings for the individual gas supply sources 222a and 222b are connected to the additional gas supply piping 208 where the individual gas constituents from the different gas supply sources flow as a mixed gas. At the piping corresponding to each of the gas supply sources 222a and 222b, one of mass flow controllers 224a and 224b is installed in order to adjust the flow rate of the specific gas constituent. The gas from either of the gas supply sources 222a and 222b is selected or the gases from the gas supply sources 222a and 222b are mixed at a predetermined gas flow rate ratio at the additional gas supply means 220 adopting the structure described above, and the additional gas from the additional gas supply means, which then flows out into the additional gas supply piping 208, is delivered into the second branch piping 206 located further downstream of the divided flow rate adjustment means 230.

The gas supply source 222a is filled with a $C_xF_y$ gas, with which an etching process, for instance, can be speeded up, whereas the gas supply source 222b is filled with a $O_2$ gas with which the deposition of, for instance, CF reaction products can be controlled. It is to be noted that the number of gas supply sources in the additional gas supply means 220 is not limited to that in the example presented in FIG. 3, and a single gas supply source or three or more gas supply sources may be housed in the additional gas supply means.

The divided flow rate adjustment means 230 includes a pressure adjustment unit 232 which adjusts the pressure inside the first branch piping 204 and a pressure adjustment unit 234 that adjusts the pressure inside the second branch piping 206. More specifically, the pressure adjustment unit 232 comprises a pressure sensor 232a that detects the pressure inside the first branch piping 204 and a valve 232b via which the degree of openness of the first branch piping 204 is adjusted, whereas the pressure adjustment unit 234 comprises a pressure sensor 234a that detects the pressure inside the second branch piping 206 and a valve 234b via which the degree of openness of the second branch piping 206 is adjusted.

The pressure adjustment units 232 and 234 are connected to a pressure controller 240 which, in response to a command issued by the control unit 300, adjusts the degrees of openness of the valves 232b and 234b based upon the pressures detected with the pressure sensors 232a and 234a respectively. The control unit 300 may control the divided flow rate adjustment means 230 through, for instance, pressure ratio control. In such a case, the pressure controller 240 adjusts the degrees of openness of the valves 232b and 234b so that the flow rates of the first and second processing gases achieve a target flow rate ratio indicated in the command from the control unit 300, i.e., so that the pressures inside the first and second branch pipings 204 and 206 achieve a target pressure ratio. It is to be noted that the pressure controller 240 may be a control board built into the divided flow rate adjustment means 230, or it may be provided in a separate frame from the divided flow rate adjustment means 230. As a further alternative, the pressure controller 240 may be installed within the control unit 300.

Before the processing on the wafer W, such as etching, a specific gas is supplied into the processing chamber 110 via the gas supply system 200 in the substrate processing apparatus 100. More specifically, the processing gas is first supplied from the processing gas supply means 210 and pressure ratio control is executed for the divided flow rate adjustment means 230. Then, once the pressure ratio of the pressures inside the first and second branch pipings 204 and 206 is adjusted to the target pressure ratio, the additional gas from the additional gas supply means 220 is delivered into the second branch piping 206.

The following problem is bound to occur if the additional gas is delivered into the second branch piping 206 while the divided flow rate adjustment means 230 remains under the pressure ratio control. Namely, as the additional gas is delivered into the second branch piping 206, the pressure inside the second branch piping 206 will rise to a level higher than the pressure inside the first branch piping 204, thereby altering the pressure ratio, and accordingly, the divided flow rate adjustment means 230 will automatically adjust the degrees of openness of the valves 232b and 234b so as to sustain the target pressure ratio. As a result, the first processing gas will flow in greater quantity than the second processing gas, causing the flow rate ratio of the flow rates of the first and second processing gases to become destabilized due to the additional gas supply.

This problem may be addressed by fixing the degrees of openness of the valves 232b and 234b in the divided flow rate adjustment means 230 once the pressure ratio of the pressures inside the first and second branch pipings 204 and 206 becomes equal to the target pressure ratio and the pressures inside the individual pipes become stabilized and then by supplying the additional gas, so as to disallow automatic engagement of the valves 232b and 234b when the additional gas is supplied and to hold the flow rate ratio of the first and second processing gases unchanged.

However, since the pressure inside the second branch piping 206 increases as the additional gas is supplied, the processing gas will be diverted toward the second branch piping 206 less readily and more processing gas will be allowed to flow into the first branch piping 204 if the settings at the valves 232b and 234b in the divided flow rate adjustment means 230 are fixed as described above. In other words, even if the settings at the valves 232b and 234b in the divided flow rate adjustment means 230 are fixed, the flow rate ratio of the flow rates of the first and second processing gases will be destabilized as the additional gas is supplied.

Accordingly, the divided flow control in the divided flow rate adjustment means 230 is switched from the pressure ratio control under which the pressures inside the first and second branch pipings 204 and 206 are controlled so as to sustain the target pressure ratio, to steady pressure control, under which the pressure inside the first branch piping 204 is held at a steady level, before the additional gas supply starts in the gas supply processing according to the present invention. Once the divided flow control is switched, the additional gas supply is started.

By adopting these measures, it is ensured that the pressure inside the first branch piping 204 is held at a steady level even as the additional gas is supplied and, as a result, even if the pressure inside the second branch piping 206 fluctuates, the processing gas that should be diverted into the second branch piping 206 is not allowed to flow into the first branch piping 204. Thus, the flow rate ratio of the first and second processing gases does not become unstable due to the additional gas supply.

(Example of Gas Supply Processing)

Figure 4:
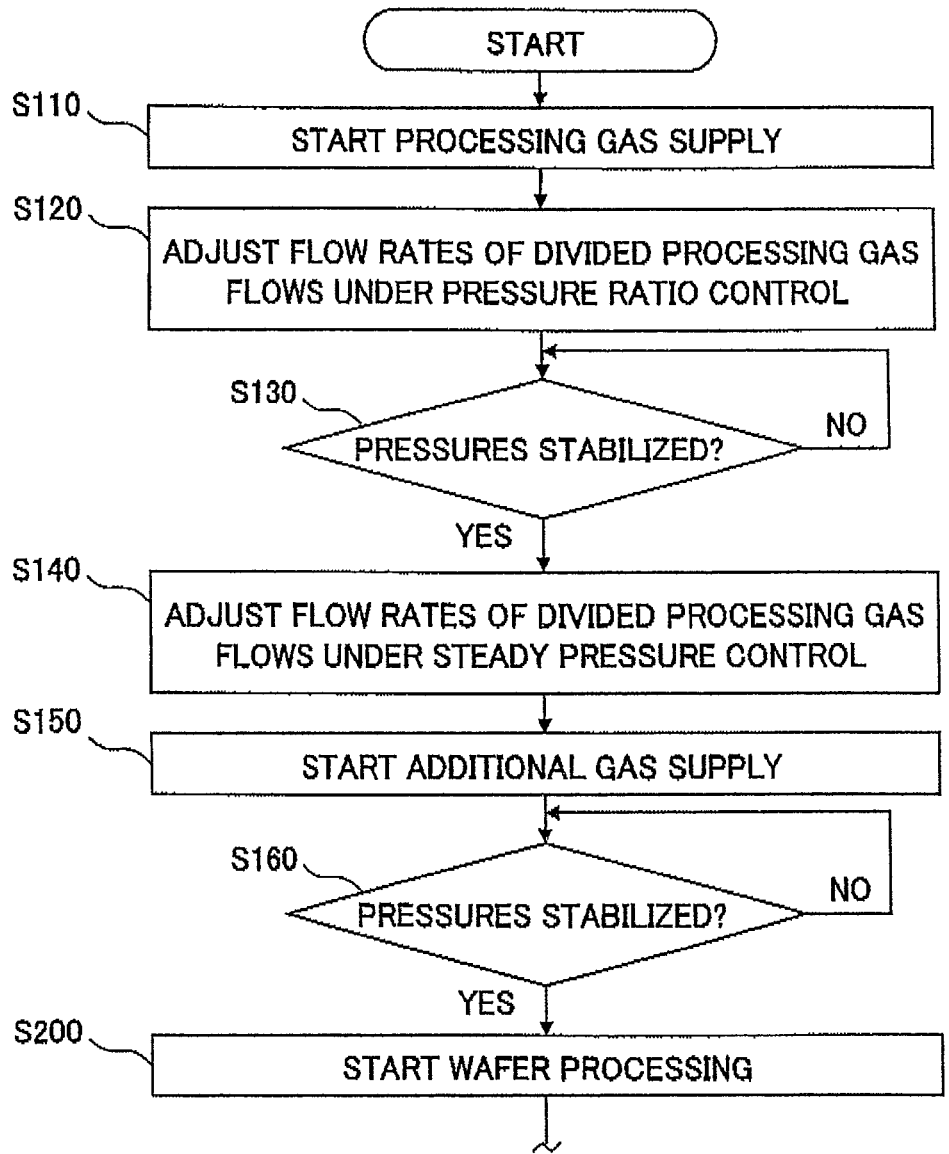
FIG. 4 presents a flowchart of an example of processing that may be executed in the substrate processing apparatus in the embodiment.

Now, a specific example of the gas supply processing executed in the embodiment of the present invention described above is explained. FIG. 4 presents a flowchart of a specific example of processing that may be executed in the substrate processing apparatus, which includes the gas supply processing according to the present invention. First, the control unit 300 starts supplying the processing gas via the processing gas supply means 210 in step S110. A predetermined type of gas within the processing gas supply means 210 thus flows into the processing gas supply piping 202 at a predetermined flow rate. More specifically, the $C_xF_y$ gas, the $O_2$ gas and the Ar gas supplied from the gas supply sources 212a to 212c at predetermined flow rates become mixed, thereby forming a mixed gas containing the $C_xF_y$ gas, the $O_2$ gas and the Ar gas with a predetermined mixing ratio. This mixed gas constituting the processing gas then flows into the processing gas supply piping 202.

Then, in step S120, the control unit 300 executes the pressure ratio control for the divided flow rate adjustment means 230, under which the divided flow rate adjustment means 230 adjusts the flow rates of the divided flows of the processing gas. More specifically, in response to a pressure ratio control command issued by the control unit 300, the divided flow rate adjustment means 230 adjusts the degrees of openness of the valves 232b and 234b based upon the pressures measured by the pressure sensors 232a and 234a under the control executed by the pressure controller 240, until the pressure ratio of the pressures inside the first and second branch pipings 204 and 206 becomes equal to the target pressure ratio. The flow rate ratio of the first and second processing gases to be delivered into the first and second buffer spaces 163a and 163b via the first and second branch pipings 204 and 206 is thus determined.

Then, in step S130, a decision is made as to whether or not the pressures in the first and second branch pipings 204 and 206 have stabilized. If it is decided that the pressures have stabilized, the control unit 300 executes the steady pressure control for the divided flow rate adjustment means 230 in step S140, under which the divided flow rate adjustment means 230 adjusts the flow rates of the divided flows of the processing gas.

Namely, in response to a steady pressure control command issued by the control unit 300, the divided flow rate adjustment means 230 adjusts the degrees of openness of the valves 232b and 234b based upon the pressures measured by the pressure sensors 232a and 234a under the control executed by the pressure controller 240, so as to hold steady the pressure of the first processing gas flowing through the first branch piping 204. It is to be noted that the mixed gas (with which the same etching process can be executed) with the same gas composition as that of the mixed gas delivered into the first buffer space 163a, at least, will also have been delivered into the second buffer space 163b at this point in time.

In step S150, the control unit 300 starts supplying the additional gas via the additional gas supply means 220. The predetermined type of additional gas is thus delivered at a predetermined flow rate from the additional gas supply means 220 into the second branch piping 206 via the additional gas supply piping 208.

In this example, a $C_xF_y$ gas (e.g., $CF_4$ gas) with which the etching process can be accelerated is supplied at the predetermined flow rate from the gas supply source 222a via the additional gas supply means 220 and the gas delivered from the additional gas supply means is then diverted into the second branch piping 206 to be supplied into the second buffer space 163b via the second branch piping 206. As a result, a processing gas with a higher $CF_4$ content compared to the processing gas delivered into the first buffer space 163a is supplied into the second buffer space 163b. The gas composition and the flow rate of the processing gas to be delivered into the second buffer space 163b are determined in this manner.

Then, in step S160, a decision is made as to whether or not the pressures inside the first and second branch pipings 204 and 206 have both stabilized. If it is decided in step S160 that the pressures have become stable, the processing of the wafer W is executed in step S200. Through the gas supply processing described above, the mixed gas flowing through the first buffer space 163a is delivered over the space near the center of the wafer W placed on the susceptor 116 and the mixed gas with a higher $CF_4$ gas concentration flowing through the second buffer space 163b is delivered to the space over the periphery of the wafer W under depressurized conditions in the substrate processing apparatus 100. As a result, the etching characteristics at the periphery of the wafer W can be adjusted relative to the etching characteristics at the central area of the wafer W, which makes it possible to assure uniform planar etching characteristics at the wafer W.

Through the processing in the flowchart presented in FIG. 4 explained above, the processing gas from the processing gas supply means 210 is diverted into the first and second branch pipings 204 and 206, the processing gas from the processing gas supply means 210 is directly delivered into the processing chamber 110 via the first branch piping 204, and a specific type of additional gases added into the processing gas flowing through the second branch piping 206 so as to deliver the processing gas into the processing chamber 110 after adjusting its gas composition and flow rate. Thus, the processing gas constituted of common gas constituents to flow through both the branch pipings 204 and 206 is supplied from the processing gas supply means 210, and the additional gas is added into the processing gas flowing through the second branch piping 206 as necessary so as to adjust its gas composition or flow rate. This means that when the processing gas is flowing through the individual branch pipings have a large number of common gas constituents, the optimal processing gas supply can be achieved with fewer pipes than that required in a structure that includes processing gas sources installed in correspondence to the individual branch pipings. Since the number of pipes in the gas supply system 200 is thus minimized, the piping structure in the gas supply system 200 is further simplified. In addition, since the flow rates of the divided flows of the processing gas are adjusted based upon the pressures inside the individual branch pipings 204 and 206, the processing gas can be supplied through a plurality of positions within the processing chamber 110 without requiring complex control.

Furthermore, by simply switching the control on the divided flow rate adjustment means 230 from the pressure ratio control to the steady pressure control prior to the start of the additional gas supply, it is ensured that the divided flow rate adjustment means 230 adjusts the valves 232b and 234b so as to hold the pressure in the first branch piping 204 at a steady level under the steady pressure control even if the pressure ratio of the pressures in the first and second branch pipings 204 and 206 fluctuates as the additional gas supply starts. As a result, the processing gas that should flow into the second branch piping 206 is not even partially allowed to flow into the first branch piping 204. Since the flow rate ratio of the first and second processing gases from the divided flow rate adjustment means 230 does not fluctuate as the additional gas supply starts as described above, the desired level of planar uniformity is assured.

It is to be noted that while an explanation is given in reference to FIG. 4 on an example in which the wafer is processed by sustaining the steady pressure control for the divided flow rate adjustment means 230 selected in step S140, the control on the divided flow rate adjustment means 230 may revert to the pressure ratio control prior to the wafer processing.

For instance, the conductance at the gas supply holes 160a may change due to a gradual increase in the temperature at the upper electrode 134 while processing a single wafer or while continuously processing a plurality of wafers, and in such a case, the gas may no longer flow smoothly.

Under such circumstances, the pressures within the first and second branch pipings 204 and 206 will both rise and thus, if the steady pressure control for the divided flow rate adjustment means 230 is sustained, the valves 232b and 234b will be adjusted so as to hold the pressure in the first branch piping 204 alone at a steady level. As a result, the ratio of the second processing gas flowing into the second branch piping 206 will gradually increase relative to the ratio of the first processing gas flowing into the first branch piping 204, resulting in destabilization of the flow rate ratio of the first and second processing gases.

This phenomenon may be prevented by reverting to the pressure ratio control prior to the wafer processing. Namely, by reverting to the pressure ratio control, it is ensured that the pressures within the first and second branch pipings 204 and 206 will both fluctuate and the pressure ratio will remain unchanged even when the conductance at the gas supply holes 160a changes. In other words, the divided flow rate adjustment means can be controlled so as to ensure that the pressure ratio of the pressures within the first and second branch pipings 204 and 206 remains unchanged. By adopting these measures, it is thus ensured that any change in the conductance at the gas supply holes 160a occurring over time will not alter the flow rate ratio of the first and second processing gases.

Figure 5:
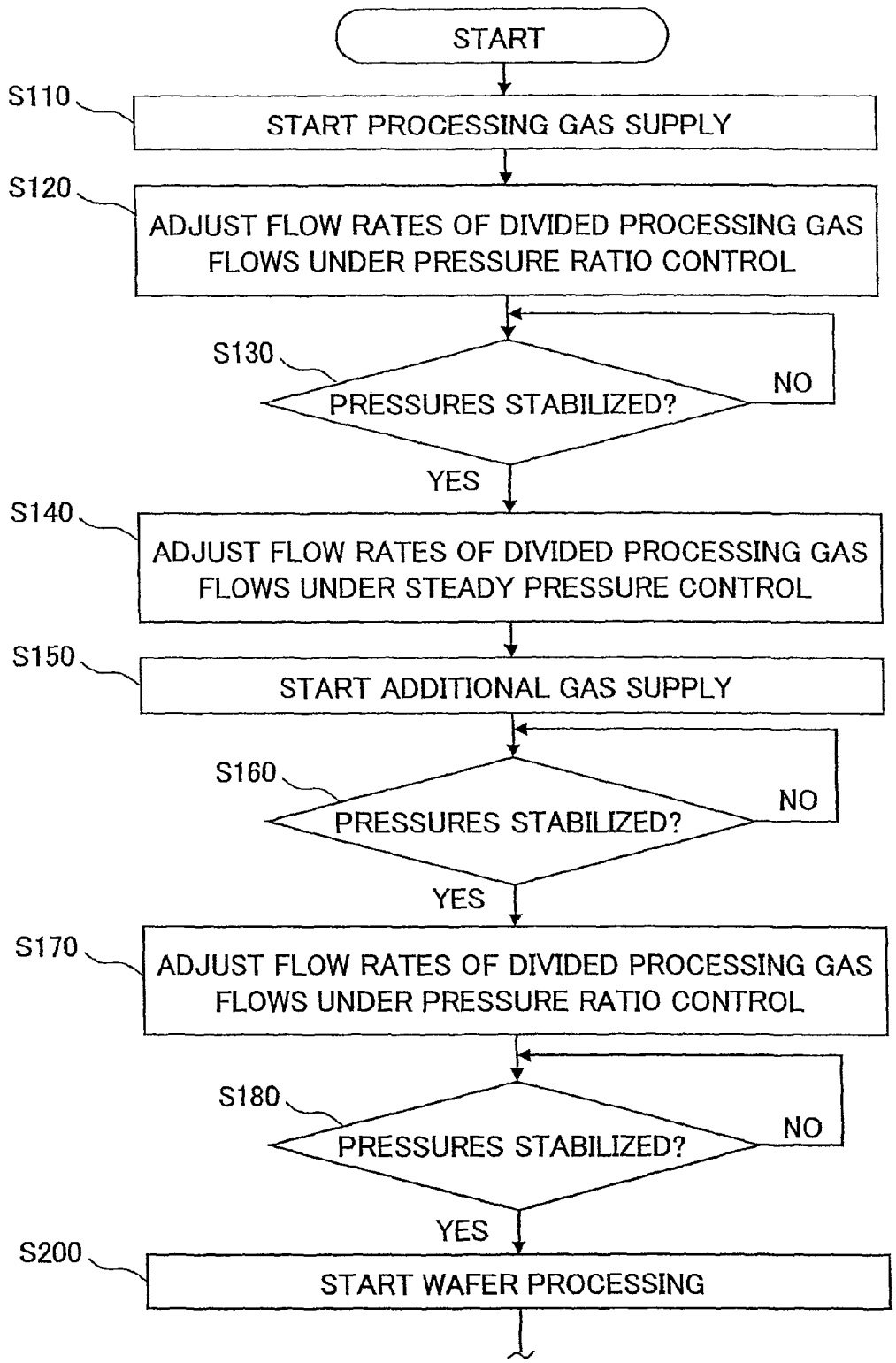
FIG. 5 presents a flowchart of another example of processing that may be executed in the substrate processing apparatus in the embodiment.

More specifically, additional processing may be executed in steps S170 and S180 prior to the processing in step S200, as shown in FIG. 5. Namely, in the flowchart presented in FIG. 5, the control on the divided flow rate adjustment means 230 is switched to the pressure ratio control by the control unit 300 in step S170 if it is decided in step S160 that the pressures in the first and second branch pipings 204 and 206 have stabilized. In more specific terms, the pressure ratio is of the pressures inside the first and second branch pipings 204 and 206 measured when the pressures have stabilized is designated as a new target pressure ratio and the control on the divided flow rate adjustment means 230 is switched to pressure ratio control for adjusting the flow rates for the divided flows so as to achieve the new target pressure ratio with the pressures in the first and second branch pipings 204 and 206. In the processing, the pressure ratio of the pressures inside the first and second branch pipings 204 and 206 measured in stable pressure conditions is designated as the new target pressure ratio for the following reasons; as the additional gas is being delivered into the second branch piping 206, the additional gas in the second branch pipe alters the pressure inside the second branch piping 206 and accordingly, the fluctuation of the pressure attributable to the additional gas delivered into the second branch piping is taken into consideration in the pressure ratio control so as to enable the divided flow rate adjustment means 230 to adjust the flow rates of the divided flows without affecting the flow rate ratio of the first and second processing gases.

Then, in step S180, a decision is made as to whether or not the pressures inside the first and second branch pipings 204 and 206 have both stabilized. If it is decided in step S180 that the pressures have become stable, the processing of the wafer W is executed in step S200.

Through the processing in FIG. 5 explained above, the wafer can be processed while preventing fluctuation of the flow rate ratio of the first and second processing gases even if the conductance at the gas supply holes 160a at the upper electrode 134 changes while executing the wafer processing.

It is to be noted that the second branch piping 206 in the embodiment may be made up of a plurality of branch pipings branching from the processing gas supply piping 202 so that the additional gas from the additional gas supply means 220 can be delivered into the plurality of second branch pipings. In this case, the processing gas can be delivered to each of a plurality of areas in the periphery of the wafer, which enables even finer control for achieving processing uniformity at the peripheral area of the wafer.

In addition, while an explanation is given above in reference to the embodiment on an example in which the processing gas supplied from the gas supply system 200 is injected toward the wafer W through the top of the processing chamber 110, the present invention is not limited to this example and it may be adopted in conjunction with a structure in which the processing gas is also delivered through another portion of the processing chamber 110 such as the side surface of the processing chamber 110 facing the plasma generation space PS. Since this will allow the specific type of processing gas to be delivered from above and the side of the plasma generation space PS, adjustment of the gas concentration within the plasma generation space PS will be enabled, which, in turn, further improves the planar uniformity of the wafer being processed.

While the invention has been particularly shown and described with respect to the preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the flow rates of the divided flow of the processing gas diverted into the branch pipings are adjusted via the pressure adjustment units, the present invention is not limited to this example and the flow rates of the divided flows of the processing gas diverted into the branch pipings may instead be adjusted by using mass flow controllers. In addition, while an explanation is given above in reference to the embodiment on an example in which the present invention is adopted in a plasma etching apparatus used to process substrates, the present invention may also be adopted in other types of substrate processing apparatuses to which processing gases are supplied, e.g., film forming apparatuses such as a plasma CVD apparatus, a sputtering apparatus and a thermal oxidation apparatus. Furthermore, the present invention may be adopted in substrate processing apparatuses in which substrates other than wafers, such as FPDs (flat panel displays) and mask reticles for photomasks, are processed or MEMS (micro-electro mechanical system) manufacturing apparatuses, as well.

What is claimed is:

1. A gas supply system that supplies gases into a processing chamber where a substrate is processed, the system comprising:
    a processing gas supply unit that supplies a processing gas to be used to process the substrate;
    a processing gas supply passage through which the processing gas from the processing gas supply unit flows;
    a first branch passage and a second branch passage branching from the processing gas supply passage and connected to the processing chamber at different positions;
    a divided flow rate adjustment unit that adjusts the divided flow rates of the processing gas diverted into the branch passages from the processing gas supply passage by using flow controllers;
    an additional gas supply unit that supplies an additional gas;
    an additional gas supply passage through which the additional gas from the additional gas supply unit is made to flow into the second branch passage at a position further downstream relative to the divided flow rate adjustment unit;
    a divided flow rate adjustment unit controller that switches between a divided flow ratio control which adjusts the divided flow rates to hold the divided flow ratio in the branch passages at a target divided flow ratio and a steady pressure control which adjusts the divided flow rates to hold the pressure in the first branch passage, and executes each of the controls on the divided flow rate adjustment unit; and
    a control unit configured to execute a process comprising:
        supplying, before processing the substrate, the processing gas by the divided flow rate adjustment unit controller via the processing gas supply unit, and executing the divided flow ratio control on the divided flow rate adjustment unit to adjust the divided flow rates so as to achieve a target divided flow ratio for the divided flow ratio in the branch passages;
        executing, once the pressures in the branch passages become stabilized through the divided flow ratio control, the steady pressure control by the divided flow rate adjustment unit controller on the divided flow rate adjustment unit to adjust the divided flow rates to hold the pressure in the first branch passage at a level achieved in stable pressure conditions; and supplying the additional gas via the additional gas supply unit after switching from the divided flow ratio control to the steady pressure control.

2. The gas supply system according to claim 1, wherein the processing gas supply unit includes a plurality of gas supply sources and supplies into the processing gas supply passage the processing gas constituted with a mixed gas achieved by mixing gases from the gas supply sources delivered at specific flow rates.

3. The gas supply system according to claim 1, wherein the additional gas supply unit includes a plurality of gas supply sources and supplies into the additional gas supply passage the additional gas constituted with a mixed gas containing selected gases among the gases from the gas supply sources or containing gases delivered from the gas supply sources with a predetermined gas flow rate ratio.

4. The gas supply system according to claim 1, wherein the first branch passage is disposed so that the processing gas flowing through the first branch passage is supplied toward a central area on a surface of the substrate in the processing chamber, and the second branch passage is disposed so that the processing gas flowing through the second branch passage is supplied toward a peripheral area on the surface of the substrate.

5. The gas supply system according to claim 1, wherein the second branch passage is made up of a plurality of branch passages branching from the processing gas supply passage so that the additional gas from the additional gas supply unit is delivered into the plurality of second branch passages.

6. A substrate processing apparatus comprising:

a processing chamber where a substrate is processed;

a processing gas supply unit that supplies a processing gas to be used to process the substrate;

a processing gas supply passage through which the processing gas from the processing gas supply unit flows;

a first branch passage and a second branch passage branching from the processing gas supply passage and connected to the processing chamber at different positions;

a divided flow rate adjustment unit that adjusts the divided flow rates of the processing gas diverted into the branch passages from the processing gas supply passage by using flow controllers;

an additional gas supply unit that supplies an additional gas;

an additional gas supply passage through which the additional gas from the additional gas supply unit is made to flow into the second branch passage at a position further downstream relative to the divided flow rate adjustment unit;

a divided flow rate adjustment unit controller that switches between a divided flow ratio control which adjusts the divided flow rates to hold the divided flow ratio in the branch passages at a target divided flow ratio and a steady pressure control which adjusts the divided flow rates to hold the pressure in the first branch passage, and executes each of the controls on the divided flow rate adjustment unit; and a control unit configured to execute a process comprising:

supplying, before processing the substrate, the processing gas using the divided flow rate adjustment unit controller and the processing gas supply unit;

executing the divided flow ratio control, using the divided flow rate adjustment unit controller, on the divided flow rate adjustment unit to adjust the divided flow rates to achieve a target divided flow ratio for the divided flow ratio in the branch passages;

executing the steady pressure control, using the divided flow rate adjustment unit controller and once the pressures in the branch passages become stabilized through the controlling, on the divided flow rate adjustment unit to adjust the divided flow rates to hold the pressure in the first branch passage at a level achieved in stable pressure conditions; and supplying the additional gas via the additional gas supply unit after switching from the divided flow ratio control to the steady pressure control.

7. The substrate processing apparatus according to claim 6, wherein the processing gas supply unit includes a plurality of gas supply sources and supplies into the processing gas supply passage the processing gas constituted with a mixed gas achieved by mixing gases from the gas supply sources delivered at specific flow rates.

8. The substrate processing apparatus according to claim 6, wherein the additional gas supply unit includes a plurality of gas supply sources and supplies into the additional gas supply passage the additional gas constituted with a mixed gas containing selected gases among the gases from the gas supply sources or containing gases delivered from the gas supply sources with a predetermined gas flow rate ratio.

9. The substrate processing apparatus according to claim 6, wherein the first branch passage is disposed so that the processing gas flowing through the first branch passage is supplied toward a central area on a surface of the substrate in the processing chamber, and the second branch passage is disposed so that the processing gas flowing through the second branch passage is supplied toward a peripheral area on the surface of the substrate.

10. The substrate processing apparatus according to claim 6, wherein the second branch passage is made up of a plurality of branch passages branching from the processing gas supply passage so that the additional gas from the additional gas supply unit is delivered into the plurality of second branch passages.

\* \* \* \* \*